(12) United States Patent
Yoshida et al.

(10) Patent No.: US 11,866,553 B2
(45) Date of Patent: Jan. 9, 2024

(54) POLYSILOXANE, COMPOSITION COMPRISING THE SAME AND CURED FILM USING THE SAME

(71) Applicant: Merck Patent GmbH, Darmstadt (DE)

(72) Inventors: Naofumi Yoshida, Yokohama (JP);
Megumi Takahashi, Kakegawa (JP);
Seishi Shibayama, Kakegawa (JP);
Katsuto Taniguchi, Kakegawa (JP);
Masanobu Hayashi, Kakegawa (JP);
Toshiaki Nonaka, Tokyo (JP)

(73) Assignee: Merck Patent GmbH, Darmstadt (DE)

( * ) Notice: Subject to any disclaimer, the term of this patent is extended or adjusted under 35 U.S.C. 154(b) by 555 days.

(21) Appl. No.: 16/768,658

(22) PCT Filed: Nov. 29, 2018

(86) PCT No.: PCT/EP2018/082943
§ 371 (c)(1),
(2) Date: May 30, 2020

(87) PCT Pub. No.: WO2019/106064
PCT Pub. Date: Jun. 6, 2019

(65) Prior Publication Data
US 2021/0171718 A1   Jun. 10, 2021

(30) Foreign Application Priority Data
Dec. 1, 2017 (JP) .................... 2017-231770

(51) Int. Cl.
| | | |
|---|---|---|
| *C08G 77/52* | (2006.01) | |
| *C08G 77/26* | (2006.01) | |
| *C08G 77/18* | (2006.01) | |
| *C08L 83/14* | (2006.01) | |
| *C09D 183/14* | (2006.01) | |
| *G03F 7/075* | (2006.01) | |
| *H01L 27/12* | (2006.01) | |

(52) U.S. Cl.
CPC ............ *C08G 77/26* (2013.01); *C08G 77/18* (2013.01); *C08G 77/52* (2013.01); *C08L 83/14* (2013.01); *C09D 183/14* (2013.01); *G03F 7/0757* (2013.01); *H01L 27/1248* (2013.01)

(58) Field of Classification Search
CPC ........ C08G 77/52; C08G 77/55; C08G 77/44; C08L 83/04

USPC ........................................................ 556/443
See application file for complete search history.

(56) References Cited

U.S. PATENT DOCUMENTS

| | | | | |
|---|---|---|---|---|
| 4,198,498 A | * | 4/1980 | LeGrand ............... | C08G 77/52 528/34 |
| 2013/0216952 A1 | | 8/2013 | Yokoyama et al. | |
| 2018/0066159 A1 | * | 3/2018 | Karkkainen ........... | G03F 7/038 |

FOREIGN PATENT DOCUMENTS

| | | | |
|---|---|---|---|
| CA | 2095781 A1 | | 11/1993 |
| CN | 103995437 A | | 8/2014 |
| CN | 105764993 A | | 7/2016 |
| EP | 2204399 A2 | | 7/2010 |
| JP | H06057160 A | | 3/1994 |
| WO | 2016/146896 | * | 9/2016 |
| WO | WO-2016146896 A1 | | 9/2016 |

OTHER PUBLICATIONS

International Search Report for PCT/EP2018/082943 dated Jan. 25, 2019.
Written Opinion of the International Searching Authority for PCT/EP2018/082943 dated Jan. 25, 2019.

* cited by examiner

*Primary Examiner* — Margaret G Moore
(74) *Attorney, Agent, or Firm* — Faegre Drinker Biddle & Reath LLP

(57) ABSTRACT

[Problem] To provide a polysiloxanecapable of forming a cured film of a thick film with high heat resistance, a composition comprising the polysiloxane, and a method of manufacturing a cured film using the composition. [Means for Solution] To provide a polysiloxane comprising a repeating unit represented by the following formula (Ib), wherein $R^2$ is each independently hydrogen, alkyl, aryl, alkenyl, and the like, a composition comprising the polysiloxane, and a method of manufacturing a cured film using the composition.

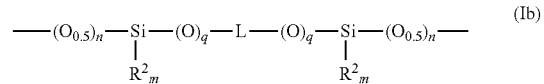

18 Claims, No Drawings

POLYSILOXANE, COMPOSITION COMPRISING THE SAME AND CURED FILM USING THE SAME

CROSS-REFERENCE TO RELATED APPLICATIONS

This application is a national stage application (under 35 U.S.C. § 371) of PCT/EP2018/082943, filed Nov. 29, 2018, which claims benefit of Japanese Application No. 2017-231770, filed Dec. 1, 2017, both of which are incorporated herein by reference in their entirety.

BACKGROUND OF THE INVENTION

Technical Field

The present invention relates to a polysiloxane and a composition comprising the polysiloxane. Further, the present invention also relates to a cured film manufactured using the composition comprising the polysiloxane and a device using the same.

Background Art

In recent years, various proposals have been made for further improving light utilization efficiency and energy saving in optical devices such as displays, light emitting diodes and solar cells. For example, in a liquid crystal display, a method is known in which a transparent planarization film is formed by coating on a TFT device and pixel electrodes are formed on the planarization film to increase the aperture ratio of the display device.

As the material for such a planarization film on a TFT substrate, a material comprising a combination of an acrylic resin and a quinonediazide compound is known. Since these materials have planarization properties and photosensitivity, contact holes and other patterns can be made. However, with improvement of the resolution and the frame frequency, the wiring becomes more complicated, so that planarization becomes more severe, and it becomes difficult to be dealt by these materials.

Polysiloxane is known as a material for forming a cured film with high heat resistance, high transparency and high resolution. In particular, silsesquioxane derivatives have been widely used due to their excellent low dielectric constant, high transmittance, high heat resistance, UV resistance, and coating uniformity. Silsesquioxane is a polymer composed of a trifunctional siloxane structural unit $RSi(O_{1.5})$, which is an intermediate between inorganic silica ($SiO_2$) and organic silicone ($R_2SiO$) in terms of chemical structure, but while it is soluble in organic solvent, the cured product obtained therefrom is a specific compound showing a characteristic high heat resistance which is similar to inorganic silica. Further, there has been a demand for a polysiloxane capable of forming a thick film, in order to improve planarity when applied and cured on a large concavo-convex substrate.

PRIOR ART DOCUMENTS

Patent Documents

[Patent document 1] JP-A 1994-057160

SUMMARY OF THE INVENTION

Problems to be Solved by the Invention

An object of the present invention is to provide a polysiloxane suitable for producing a cured film having excellent characteristics such as being free from cracks when thickened. Further, an object of the present invention is to provide a polysiloxane composition which can form patterns having excellent characteristics, and a method for producing a cured film using the composition.

Means for Solving the Problems

The polysiloxane (Pa) according to the present invention comprising:
a repeating unit represented by the following formula (Ia):

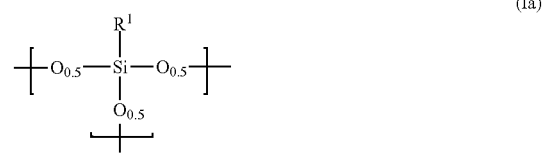

wherein,
$R^1$ is hydrogen, a monovalent to trivalent, linear, branched or cyclic, saturated or unsaturated $C_{1-30}$ aliphatic hydrocarbon group, or a monovalent to trivalent, $C_{6-30}$ aromatic hydrocarbon group,
in said aliphatic hydrocarbon group and said aromatic hydrocarbon group, one or more methylene are unsubstituted or substituted with oxy, imide or carbonyl, one or more hydrogens are unsubstituted or substituted with fluorine, hydroxy or alkoxy, and one or more carbons are unsubstituted or substituted with silicon,
when $R^1$ is divalent or trivalent, $R^1$ connects Si atoms contained in a plurality of repeating units; and
a repeating unit represented by the following formula (Ib):

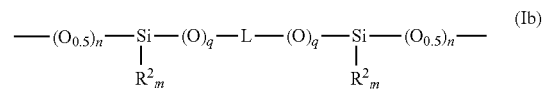

wherein,
$R^2$ is each independently hydrogen, $C_{1-10}$ alkyl, $C_{6-20}$ aryl or $C_{2-10}$ alkenyl, which is unsubstituted or substituted with oxygen or nitrogen, or a linking group represented by the formula (Ib'):

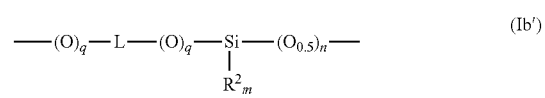

L is each independently $C_{6-20}$ arylene, which is unsubstituted or substituted with oxygen or nitrogen,
m is each independently an integer of 0 to 2,
n is each independently an integer of 1 to 3,
q is each independently 0 or 1,
the total number of n, the number of $O_{0.5}$, and m, the number of $R^2$, bonding to one Si is 3, and the total number of q contained in the repeating unit represented by the above formula (Ib) is 1 or more.

Further, the composition according to the present invention comprises above-mentioned polysiloxane (Pa) and a solvent.

Further, the method for producing a cured film according to the present invention comprises applying the above-mentioned composition on a substrate and heating it.

Further, the electronic device according to the present invention comprises above-mentioned cured film.

Effects of the Invention

According to the polysiloxane (Pa) of the present invention, it is possible to form a cured film that is highly heat resistant, hardly cracked when thickened, and can form a good pattern. In addition, the obtained cured film has excellent transmitting property. The composition comprising the polysiloxane (Pa) of the present invention can form positive type or negative type patterns by imparting photosensitivity.

DETAILED DESCRIPTION OF THE INVENTION

Mode for Carrying Out the Invention

Embodiments of the present invention are described in detail below. Hereinafter, symbols, units, abbreviations and terms have the following meanings unless otherwise specified.

In the present specification, when numerical ranges are indicated using "to" or "–", they include both endpoints, and units thereof are common. For example, 5 to 25 mol % means 5 mol % or more and 25 mol % or less.

In the present specification, the hydrocarbon means one which includes carbon and hydrogen, and optionally oxygen or nitrogen. The hydrocarbon group means a monovalent or divalent or more valent hydrocarbon.

In the present specification, the aliphatic hydrocarbon means a linear, branched or cyclic aliphatic hydrocarbon, and the aliphatic hydrocarbon group means a monovalent or divalent or more valent aliphatic hydrocarbon. The aromatic hydrocarbon means a hydrocarbon containing an aromatic ring which may have an aliphatic hydrocarbon group as a substituent or may be optionally condensed with an aliphatic ring. The aromatic hydrocarbon group means a monovalent or divalent or more valent aromatic hydrocarbon. These aliphatic hydrocarbon group and aromatic hydrocarbon group optionally contain fluorine, oxy, hydroxy, amino, carbonyl or silyl and the like. In addition, the aromatic ring means a hydrocarbon having a conjugated unsaturated ring structure, and the aliphatic ring means a hydrocarbon having a ring structure but no conjugated unsaturated ring structure.

In the present specification, the alkyl means a group obtained by removing one freely selected hydrogen from a linear or branched saturated hydrocarbon, including linear alkyl and branched alkyl, and the cycloalkyl means a group obtained by removing one hydrogen from a saturated hydrocarbon containing a cyclic structure, and optionally including a linear or branched alkyl as a side chain in a cyclic structure.

In the present specification, the aryl means a group obtained by removing one freely selected hydrogen from an aromatic hydrocarbon. The alkylene means a group obtained by removing two freely selected hydrogens from a linear or branched saturated hydrocarbon. The arylene means a hydrocarbon group obtained by removing two freely selected hydrogens from an aromatic hydrocarbon.

In the present specification, the descriptions such as "$C_{x\text{-}y}$", "$C_x\text{-}C_y$" and "$C_x$" mean the number of carbons in the molecule or substituent. For example, $C_{1\text{-}6}$ alkyl means alkyl having 1 or more and 6 or less carbons (methyl, ethyl, propyl, butyl, pentyl, hexyl etc.). In the present specification, the fluoroalkyl refers to one in which one or more hydrogens in alkyl are replaced with fluorine, and the fluoroaryl refers to one in which one or more hydrogens in aryl are replaced with fluorine.

In the present specification, when polymer has plural types of repeating units, these repeating units copolymerize. These copolymerizations are any of alternating copolymerization, random copolymerization, block copolymerization, graft copolymerization, or a mixture thereof.

In the present specification, % represents mass %, and the ratio represents mass ratio.

In the present specification, Celsius is used as the temperature unit. For example, 20 degrees means 20 degrees Celsius.

<Polysiloxane>

The polysiloxane refers to a polymer having a main chain of Si—O—Si bond (siloxane bond). In the present specification, a general polysiloxane shall also include a silsesquioxane polymer represented by the formula $(RSiO_{1.5})_n$.

[Polysiloxane (Pa)]

The polysiloxane (Pa) of the present invention comprising:

a repeating unit represented by the following formula (Ia):

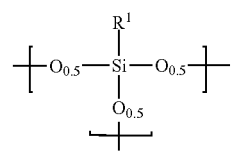

(Ia)

wherein, $R^1$ is hydrogen, a monovalent to trivalent, linear, branched or cyclic, saturated or unsaturated $C_{1\text{-}30}$ aliphatic hydrocarbon group, or a monovalent to trivalent, $C_{6\text{-}30}$ aromatic hydrocarbon group, in said aliphatic hydrocarbon group and said aromatic hydrocarbon group, one or more methylene are unsubstituted or substituted with oxy, imide or carbonyl, one or more hydrogens are unsubstituted or substituted with fluorine, hydroxy or alkoxy, and one or more carbons are unsubstituted or substituted with silicon, when $R^1$ is divalent or trivalent, $R^1$ connects Si atoms contained in a plurality of repeating units; and a repeating unit represented by the following formula (Ib):

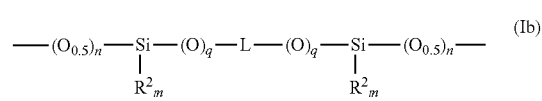

(Ib)

wherein, $R^2$ is each independently hydrogen, $C_{1\text{-}10}$ alkyl, $C_{6\text{-}20}$ aryl or $C_{2\text{-}10}$ alkenyl, which is unsubstituted or substituted with oxygen or nitrogen, or a linking group represented by the formula (Ib'):

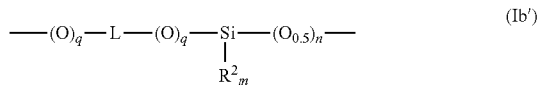
(Ib')

L is each independently $C_{6-20}$ arylene, which is unsubstituted or substituted with oxygen or nitrogen,
m is each independently an integer of 0 to 2,
n is each independently an integer of 1 to 3,
q is each independently 0 or 1,
the total number of n, the number of $O_{0.5}$, and m, the number of $R^2$, bonding to one Si is 3, and
the total number of q contained in the repeating unit represented by the above formula (Ib) is 1 or more.

In the formula (Ia), when $R^1$ is a monovalent group, examples of $R^1$ include (i) alkyl such as methyl, ethyl, propyl, butyl, pentyl, hexyl, heptyl, octyl and decyl, (ii) aryl such as phenyl, tolyl and benzyl, (iii) fluoroalkyl such as trifluoromethyl, 2,2,2-trifluoroethyl and 3,3,3-trifluoropropyl, (iv) fluoroaryl, (v) cycloalkyl such as cyclohexyl, (vi) N-containing group having an amino or an imide structure such as isocyanate and amino, (vii) O-containing group having an epoxy structure such as glycidyl, or an acryloyl or a methacryloyl structure. Preference is given to methyl, ethyl, propyl, butyl, pentyl, hexyl, phenyl, tolyl, glycidyl and isocyanate. As fluoroalkyl, perfluoroalkyl is preferred, especially trifluoromethyl and pentafluoroethyl are preferred. Compounds in which $R^1$ is methyl are preferred, because raw materials thereof are easily obtained, and they have high film hardness after curing and have high chemical resistance. In addition, phenyl is preferred because it increases solubility of the polysiloxane in the solvent and the cured film is less prone to cracking. When $R^1$ has hydroxy, glycidyl, isocyanate, or amino, adhesiveness with the substrate is improved, which is preferable.

Further, when $R^1$ is a divalent or trivalent group, $R^1$ is preferably, for example, (i) a group obtained by removing two or three hydrogens from alkane such as methane, ethane, propane, butane, pentane, hexane, heptane, octane and decane, (ii) a group obtained by removing two or three hydrogens from cycloalkane such as cycloheptane, cyclohexane and cyclooctane, (iii) a group obtained by removing two or three hydrogens from aromatic compound composed only of hydrocarbon such as benzene and naphthalene, and (iv) a group obtained by removing two or three hydrogens from N- and/or O-containing alicyclic hydrocarbon compound and containing an amino group, an imino group and/or a carbonyl group, such as piperidine, pyrrolidine and isocyanurate. (iv) is more preferred because it improves pattern reflow and increases adhesiveness to the substrate.

In the formulae (Ib) and (Ib'), $R^2$ is preferably unsubstituted $C_{1-10}$ alkyl, more preferably unsubstituted $C_{1-3}$ alkyl. It is also preferable that m is 2 and n is 1. More preferably, $R^2$ is unsubstituted $C_{1-10}$ alkyl, further preferably unsubstituted $C_{1-3}$ alkyl. In the general formulae (Ib) and (Ib'), L is preferably an unsubstituted $C_{6-20}$ arylene, more preferably phenylene, naphthylene and biphenylene. It is also preferable that all q are 1.

When the repeating unit represented by the formula (Ib) has a high mixing ratio, the strength and heat resistance of the cured film are deteriorated, so that it is preferably 0.5 to 50 mol % based on the total number of the repeating units of the polysiloxane (Pa).

Further, the polysiloxane (Pa) according to the present invention may optionally have a repeating unit represented by the following formula (Ic).

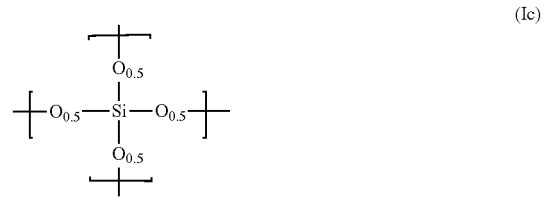
(Ic)

When the repeating unit represented by the formula (Ic) has a high mixing ratio, photosensitivity of the composition may decrease, compatibility with a solvent, an additive and the like may decrease, and cracks may be easy to be generated due to high film stress. Thus, the repeating unit represented by the formula (Ic) is preferably 40 mol % or less, more preferably 20 mol % or less based on the total number of the repeating units of the polysiloxane (Pa).

The polysiloxane (Pa) has a structure in which above mentioned repeating units or blocks are bonded, and preferably has silanol group at the terminal. Such a silanol group is a group which a bonding hand of said repeating units or blocks is bonded to —$O_{0.5}$H.

[Polysiloxane (Pb)]

The composition according to the present invention comprises a polysiloxane (Pa) and a solvent. The composition according to the present invention can further comprise a polysiloxane (Pb) which is different from a polysiloxane (Pa). Such a polysiloxane (Pb) preferably comprises a repeating unit represented by said formula (Ia) and no repeating unit represented by said formula (Ib). In other words, the polysiloxane (Pa) is characterized in comprising a repeating unit represented by for the formula (Ib), and the polysiloxane (Pb) is characterized in comprising no repeating unit represented by for the formula (Ib). The structure except the repeating unit represented by the formula (Ib) in the polysiloxane (Pa) and the structure in the polysiloxane (Pb) do not necessarily correspond to each other. Specifically, the molecular weight, the ratio of the repeating unit (Ia), $R^1$, and the like of the polysiloxane (Pb) can be independently determined from that of the polysiloxane (Pa).

Further, the polysiloxane (Pb) may optionally have a repeating unit represented by the formula (Ic), other than the formula (Ia). The polysiloxane (Pb) preferably comprises the repeating unit represented by the formula (Ic). The repeating unit represented by the formula (Ia) is preferably 60 to 100 mol %, more preferably 80 to 90 mol %, and the repeating unit represented by the formula (Ic) is preferably 40 mol % or less, more preferably 10 to 20 mol %, based on the total number of the repeating units of the polysiloxane (Pb).

The polysiloxane (Pb) has a structure in which above mentioned repeating units or blocks are bonded, and preferably has silanol group at the terminal. Such a silanol group is a group which a bonding hand of said repeating units or blocks is bonded to —$O_{0.5}$H.

The composition according to the present invention comprises the polysiloxane (Pa) or the mixture of the polysiloxane. To exhibit the effects of the present invention strongly, the ratio of the repeating unit (Ib) is preferably 0.5 to 50 mol %, more preferably 3 to 30 mol %, based on the total number of the repeating units contained in all polysiloxane. Further, the mixing ratio of the polysiloxane (Pa):the polysiloxane (Pb) is preferably 5:95 to 100:0, based on the mass. The mixing ratio is adjusted depending on the mixing ratio of the repeating units (Ia) and (Ib) contained in (Pa). When the polysiloxane is a mixture, the mass average molecular weight of the mixture is usually 500 to 25,000, and preferably from 1,000 or more and 20,000 or less from the viewpoint of solubility in an organic solvent and solubility in an alkali developing solution.

[Synthesis Method of Polysiloxane (Pa) and Polysiloxane (Pb)]

Such a polysiloxane (Pa) can be obtained through hydrolysis and condensation optionally in the presence of an acidic catalyst or a basic catalyst, of
a silicon compound represented by the following formula (ia):

$$R^{1'}[Si(OR^a)_3]_p \quad (ia)$$

wherein, p is an integer of 1 to 3, $R^{1'}$ is hydrogen, a monovalent to trivalent, linear, branched or cyclic, saturated or unsaturated $C_{1-30}$ aliphatic hydrocarbon group, or a monovalent to trivalent, $C_{6-30}$ aromatic hydrocarbon group, in said aliphatic hydrocarbon group and said aromatic hydrocarbon group, one or more methylene are unsubstituted or substituted with oxy, imide or carbonyl, one or more hydrogens are unsubstituted or substituted with fluorine, hydroxy or alkoxy, and one or more carbons are unsubstituted or substituted with silicon, $R^a$ represents $C_{1-10}$ alkyl, and a silicon compound represented by the following formula (ib):

$$(OR^b)_{n'}\!-\!\underset{\underset{R^{2'}_{m'}}{|}}{Si}\!-\!(O)_{q'}\!-\!L'\!-\!(O)_{q'}\!-\!\underset{\underset{R^{2'}_{m'}}{|}}{Si}\!-\!(OR^b)_{n'} \quad (ib)$$

wherein, $R^{2'}$ is each independently hydrogen, $C_{1-10}$ alkyl, $C_{6-20}$ aryl or $C_{2-10}$ alkenyl, which is unsubstituted or substituted with oxygen or nitrogen, or a linking group represented by the formula (ib'):

$$-\!(O)_{q'}\!-\!L'\!-\!(O)_{q'}\!-\!\underset{\underset{R^{2'}_{m'}}{|}}{Si}\!-\!(OR^b)_{n'} \quad (ib')$$

$R^b$ is each independently $C_{1-10}$ alkyl,

L' is each independently $C_{6-20}$ arylene, which is unsubstituted or substituted by oxygen or nitrogen, m' is each independently an integer of 0 to 2, n' is each independently an integer of 1 to 3, q' is each independently 0 or 1, the total number of n', the number of $OR^b$, and m', the number of $R^{2'}$, bonding to one Si is 3, and the total number of q contained in the repeating unit represented by the above formula (ib) is 1 or more.

In the formula (ia), preferable $R^{1'}$ is the same as the preferred $R^1$ described above.

In the formula (ia), examples of $R^a$ include methyl, ethyl, n-propyl, isopropyl, n-butyl and the like. In formula (ia), $R^a$ is contained in plural, but each $R^a$ may be identical or different.

Specific examples of the silicon compound represented by the formula (ia) include, for example, methyltrimethoxysilane, methyltriethoxysilane, methyltriisopropoxysilane, methyltri-n-butoxysilane, ethyltrimethoxysilane, ethyltriethoxysilane, ethyltriisopropoxysilane, ethyltri-n-butoxysilane, n-propyltrimethoxysilane, n-propyltriethoxysilane, n-butyltrimethoxysilane, n-butyltriethoxysilane, n-hexyltrimethoxysilane, n-hexyltriethoxysilane, decyltrimethoxysilane, phenyltrimethoxysilane, phenyltriethoxysilane, trifluoromethyltrimethoxysilane, trifluoromethyltriethoxysilane, 3,3,3-trifluoropropyltrimethoxysilane, tris-(3-trimethoxysilylpropyl)isocyanurate, tris-(3-triethoxysilylpropyl)isocyanurate, tris-(3-trimethoxysilylethyl)isocyanurate and the like. Among them, methyltrimethoxysilane, methyltriethoxysilane, methyltripropoxysilane and phenyltrimethoxysilane are preferable.

In the formula (ib), $R^{2'}$ is preferably $C_{1-10}$ alkyl, $C_{6-20}$ aryl, or $C_{2-10}$ alkenyl, more preferably $C_{1-4}$ alkyl or $C_{6-11}$ aryl, $R^b$ is the same as $R^a$, L' is preferably unsubstituted $C_{6-20}$ arylene, more preferably phenylene, naphthylene, or biphenylene, and m' is preferably 2, and preferably all q' are 1.

Preferable specific examples of the silicon compound represented by the formula (ib) include 1,4-bis(dimethylethoxysilyloxy)benzene and 1,4-bis(methyldiethoxysilyloxy)benzene.

Here, two or more types of silane compounds (ia) and (ib) may also be used in combination.

A silane compound represented by the following formula (ic) can be combined with the silane compounds represented by the above formulae (ia) and (ib) to obtain a polysiloxane. When the silane compound represented by the formula (ic) is used in this way, a polysiloxane containing the repeating units (Ia), (Ib) and (Ic) can be obtained.

$$Si(OR^c)_4 \quad (ic)$$

wherein, $R^c$ represents $C_{1-10}$ alkyl. Preferred $R^c$ is methyl, ethyl, n-propyl, isopropyl, n-butyl and the like.

Similarly, the polysiloxane (Pb) can be obtained through hydrolysis and condensation optionally in the presence of an acidic catalyst or a basic catalyst, of suitable silicon compound.

The molecular weight of the polysiloxane (Pa) and (Pb) is usually not limited, but the polysiloxane having higher molecular weight tends to improve coatability. On the other hand, the lower molecular weight causes little limitation on synthesis conditions and it can be synthesized easily. The polysiloxane having very high molecular weight is difficult to syhtesize. From these reasons, the mass average molecular weight of the polysiloxane is usually 500 or more and 25,000 or less, and preferably from 1,000 or more and 20,000 or less from the viewpoint of solubility in an organic solvent and solubility in an alkali developing solution. Here, the mass average molecular weight is a mass average molecular weight in terms of polystyrene and can be measured by gel permeation chromatography based on polystyrene.

When the polysiloxane (Pa) according to the present invention is contained in a photosensitive composition, a cured film is formed by applying on a substrate, image wise exposing, and developing. In this case, it is necessary that a difference in solubility is generated between the exposed portion and the unexposed portion. In the case of a positive type composition, the coating film in the exposed portion (in the case of a negative type composition, the coating film in the unexposed portion) should have solubility in the developing solution of a certain level or above. For example, if the rate of dissolution in 2.38% tetramethylammonium hydroxide (hereinafter sometimes referred to as TMAH) aqueous solution of the coating film after prebaking (hereinafter sometimes referred to as alkali dissolution rate or ADR, which is described in detail later) is 50 Å/sec or more, forming a pattern by exposure-development is considered possible. However, since solubility required varies depending on the film thickness of the cured film to be formed and developing conditions, polysiloxane according to the developing conditions should be appropriately selected. Although it varies depending on the type and amount of the photosensitive agent or the silanol condensation catalyst contained in the composition, for example, when the film thickness is 0.1 to 100 µm (1,000 to 1,000,000 Å), in the case of a positive type composition, the dissolution rate in 2.38% TMAH aqueous solution is preferably 50 to 5,000 Å/sec, more preferably 200 to 3,000 Å/sec. In the case of negative type composition, the dissolution rate in 2.38% TMAH aqueous solution is preferably 50 to 20,000 Å/sec, more preferably 1,000 to 10,000 Å/sec.

For the polysiloxane (Pa) of the present invention, a polysiloxane having any ADR in the above-mentioned ranges may be selected according to the application and required properties. Further, it is also possible to combine polysiloxanes having different ADRs to get a mixture having a desired ADR.

The polysiloxane having different alkali dissolution rate and mass average molecular weight can be prepared by changing catalyst, reaction temperature, reaction time or polymer. Using polysiloxanes having different alkali dissolution rates in combination, it is possible to improve the reduction of insoluble residue after development, reduction of pattern reflow, pattern stability and the like.

Such a polysiloxane includes, for example, (M) a polysiloxane, the film after pre-baking of which is soluble in 2.38 mass % TMAH aqueous solution and has the dissolution rate of 200 to 3,000 Å/sec.

Further, the composition having a desired dissolution rate can be obtained optionally by mixing with (L) a polysiloxane, the film after pre-baking of which is soluble in 5 mass % TMAH aqueous solution and has the dissolution rate of 1,000 Å/sec or less, or (H) a polysiloxane, the film after prebaking of which has the dissolution rate of 4,000 Å/sec or more in 2.38 mass % TMAH aqueous solution.

The polysiloxane used in the present invention is one having a branched structure due to the use of the silicon compound represented by the formula (ia) as a raw material. Here, by optionally combining a bifunctional silane compound as a raw material of the polysiloxane, the polysiloxane can be made to partially have a straight chain structure. However, since heat resistance is lowered, it is preferable that the straight chain structure portion is less. Specifically, the straight chain structure derived from the bifunctional silane of the polysiloxane is preferably 30 mol % or less of the total polysiloxane structure.

[Measurement of Alkaline Dissolution Rate (ADR) and Calculation Method Thereof]

Using TMAH Aqueous Solution as an Alkaline Solution, the alkali dissolution rate of polysiloxane or a mixture thereof is measured and calculated as described below.

Polysiloxane is diluted with propylene glycol monomethyl ether acetate (hereinafter referred to as PGMEA) so as to be 35 mass % and dissolved with stirring at room temperature with a stirrer for 1 hour. In a clean room under an atmosphere of temperature of 23.0±0.5° C. and humidity of 50±5.0%, using a pipette, 1 cc of the prepared polysiloxane solution is dropped on the center portion of a 4-inch silicon wafer having thickness of 525 µm, spin-coated so as to be a thickness of 2±0.1 µm, and then heated on a hot plate at 100° C. for 90 seconds to remove the solvent. The film thickness of the coating film is measured with a spectroscopic ellipsometer (manufactured by JA Woollam Co., Inc.).

Next, the silicon wafer having this film was gently immersed in a glass petri dish having a diameter of 6 inches, into which 100 ml of TMAH aqueous solution adjusted to 23.0±0.1° C. and having a predetermined concentration was put, then allowed to stand, and the time until the coating film disappeared was measured. Dissolution rate is obtained by dividing the initial film thickness by the time until 10 mm inside part from the wafer edge of the film disappears. In the case that the dissolution rate is remarkably slow, the wafer is immersed in an aqueous TMAH solution for a certain period and then heated for 5 minutes on a hot plate at 200° C. to remove moisture taken in the film during the dissolution rate measurement, and film thickness is measured. The dissolution rate is calculated by dividing the variation of the film thickness between before and after immersion by the immersing time. The above measurement is carried out 5 times, and the average of the obtained values is taken as the dissolution rate of the polysiloxane.

<Composition>

The composition according to the present invention comprises the above mentioned polysiloxane (Pa) and a Solvent.

[Solvent]

This solvent is selected from those which uniformly dissolve or disperse each component contained in the composition. Specific examples of the solvent include ethylene glycol monoalkyl ethers such as ethylene glycol monomethyl ether, ethylene glycol monoethyl ether, ethylene glycol monopropyl ether and ethylene glycol monobutyl ether; diethylene glycol dialkyl ethers such as diethylene glycol dimethyl ether, diethylene glycol diethyl ether, diethylene glycol dipropyl ether and diethylene glycol dibutyl ether; ethylene glycol alkyl ether acetates such as methyl cellosolve acetate and ethyl cellosolve acetate; propylene glycol monoalkyl ethers such as propylene glycol monomethyl ether (PGME) and propylene glycol monoethyl ether; propylene glycol alkyl ether acetates such as PGMEA, propylene glycol monoethyl ether acetate and propylene glycol monopropyl ether acetate; aromatic hydrocarbons such as benzene, toluene and xylene; ketones such as methyl ethyl ketone, acetone, methyl amyl ketone, methyl isobutyl ketone and cyclohexanone; and alcohols such as isopropanol and propane diol. PGMEA or PGME is preferable. These solvents are used alone or in combination of two or more kinds.

The mixing ratio of the solvent varies depending on the application method and the demand for the film thickness after coating. For example, in the case of spray coating, it becomes 90 mass % or more based on the total mass of the polysiloxane and optional components, but in the case of slit coating of a large glass substrate used for manufacturing displays, usually 50 mass % or more, preferably 60 mass % or more, and usually 90 mass % or less, preferably 85 mass % or less.

The composition according to the present invention may optionally contain additives. The additives are explained in the following.

The composition according to the present invention is a non-photosensitive composition, a positive type photosensitive composition, or negative type photosensitive composition. In the present invention, positive type photosensitive type composition means the composition which can form positive image by coating it to form a coating film, exposing it to increase the dissolution rate of the exposed portion to the alkali developer, and removing the exposed portion using the developer. Negative type photosensitive type composition means the composition which can form negative image by coating it to form a coating film, exposing it to decrease the dissolution rate of the exposed portion to the alkali developer, and removing the unexposed portion using the developer.

[Diazonaphthoquinone Derivative]

The positive type photosensitive composition according to the present invention preferably comprises a diazonaphthoquinone derivative as a photosensitizer. The composition comprising the diazonaphtoquinone derivative can form a positive type image, in which the exposed portion becomes soluble in an alkali developing solution, thereby being removed by development. By the exposing, the solubility of the exposed portion becomes higher due to the generation of indenecarboxylic acid, and the solubility of the unexposed portion becomes lower due to interactions with silanol group remained in the polysiloxane.

Preferred diazonaphthoquinone derivative to be used as a photosensitizer in the present invention is a compound prepared by ester bonding of naphthoquinone diazide sulfonic acid to a compound having a phenolic hydroxy. Although its structure is not particularly limited, it is preferably an ester compound with a compound having one or more phenolic hydroxy. As the naphthoquinone diazide sulfonic acid, 4-naphthoquinonediazidosulfonic acid or 5-naphthoquinonediazidosulfonic acid can be used. Since 4-naphthoquinone diazide sulfonic acid ester compound has absorption in the i-line (wavelength 365 nm) region, it is suitable for i-line exposure. In addition, since 5-naphthoquinone diazide sulfonic acid ester compound has absorption in a wide range of wavelength, it is suitable for exposure in a wide range of wavelength. It is preferable to select an appropriate photosensitizer depending on the wavelength to be exposed and the type of silanol condensation catalyst. When a thermal acid generator, a thermal base generator, a photo acid generator, a photo base generator having a low absorption in said wavelength range of the photosensitizer, or a photo thermal acid generator or a photo thermal base generator as the silanol condensation catalyst is selected, 4-naphthoquinone diazide sulfonic acid ester compound and 5-naphthoquinonediazide sulfonic acid ester compound are preferable because they can form an excellent composition. 4-naphthoquinone diazide sulfonic acid ester compound and 5-naphthoquinone diazide sulfonic acid ester compound can be and used in combination.

The compound having a phenolic hydroxy is not particularly limited, and examples thereof include bisphenol A, BisP-AF, BisOTBP-A, Bis26B-A, BisP-PR, BisP-LV, BisP-OP, BisP-NO, BisP-DE, BisP-AP, BisOTBP-AP, TrisP-HAP, BisP-DP, TrisP-PA, BisOTBP-Z, BisP-FL, TekP-4HBP, TekP-4HBPA, TrisP-TC (trade name, manufactured by Honshu Chemical Industry Co., Ltd.).

Although the optimum amount varies depending on the esterification ratio of naphthoquinone diazide sulfonic acid, or the physical properties of the polysiloxane to be used, the required photosensitivity and the dissolution contrast between the exposed part and the unexposed part, the addition amount of the diazonaphthoquinone derivative is preferably 1 to 20 parts by mass, more preferably 3 to 15 parts by mass based on 100 parts by mass of the total mass of polysiloxane. When the addition amount of the diazonaphthoquinone derivative is 1 part by mass or more, the dissolution contrast between the exposed part and the unexposed part becomes high, and good photosensitivity is obtained. In addition, in order to obtain further better dissolution contrast, it is preferably 3 parts by mass or more. On the other hand, the smaller the addition amount of the diazonaphthoquinone derivative, the better the colorless transparency of the cured film and the higher the transmittance, which is preferable.

[Silanol Condensation Catalyst]

The negative type photosensitive composition according to the present invention preferably comprises one or more of silanol condensation catalysts selected from the group consisting of a photo acid generator, a photo base generator, a photo thermal acid generator or a photo thermal base generator. When positive type photosensitivity is imparted, the composition preferably comprises one or more silanol condensation catalyst, and more preferably silanol condensation catalyst se selected from a photo acid generator, a photo base generator, a photo thermal acid generator or a photo thermal base generator. They are preferably selected depending on the polymerization reaction or crosslinking reaction utilized in the cured film manufacturing process.

Although the optimum amount varies depending on the kind of the active substance to be generated by decomposition, the generation amount thereof, required photosensitivity, dissolution contrast between the exposed portion and the unexposed portion, the addition amount of the silanol condensation catalyst is preferably 0.1 to 10 parts by mass, more preferably 0.5 to 5 parts by mass based on 100 parts by mass of the total mass of the polysiloxane. When the addition amount is less than 0.1 parts by mass, the amount of acid or base to be generated is too small, polymerization during the post-baking is not accelerated, and pattern reflow tends to occur easily. On the other hand, when the addition amount of the silanol condensation catalyst is more than 10 parts by mass, cracks may be generated in the formed cured film or coloration due to decomposition of the silanol condensation catalyst may become remarkable, so that colorless transparency of the cured film sometimes decreases. If the addition amount is too large, thermal decomposition causes degradation of electrical insulation of the cured product and release of gas, which may cause problems in the subsequent process. In addition, the resistance of the cured film to a photoresist stripper solution containing, as a main ingredient, monoethanolamine or the like may be decreased.

In the present invention, the photo acid generator or photo base generator means the composition in which its bond is cleaved by the exposure and an acid or a base is generated. It is considered that the generated acid or base contributes to the polymerization of the polysiloxane. Here, examples of the light include visible light, ultraviolet light, infrared light, X ray, electron beam, α ray, γ ray or the like.

It is preferable that the photo acid generator or photo base generator used in the positive type photosensitive composition generates an acid or a base not at the image-wise exposure to light for pattern projection (hereinafter referred to as "first exposure") but at the subsequent flood exposure, and it is preferable that absorption at the wavelength at the time of the first exposure is small. For example, when the first exposure is performed with g-line (peak wavelength 436 nm) and/or h-line (peak wavelength 405 nm) and the wavelength of the second exposure is set g+h+i-lines (peak wavelength 365 nm), it is preferable that the photo acid generator or the photo base generator has the absorbance at wavelength of 365 nm which is larger than the absorbance at wavelength of 436 nm and/or 405 nm. Specifically, the ratio of (the absorbance at wavelength of 365 nm)/(the absorbance at wavelength of 436 nm), or the ratio of (the absorbance at wavelength of 365 nm)/(the absorbance at wavelength of 405 nm) is preferably 2 or more, more preferably 5 or more, further preferably 10 or more, and the most preferably 100 or more.

Here, the ultraviolet-visible absorption spectrum is measured using dichloromethane as a solvent. The measuring equipment is not particularly limited, but for example, Cary 4000 UV-Vis spectrophotometer (Agilent Technologies, Inc.) can be used.

Examples of the photo acid generators, which can be freely selected from commonly used ones, include diazomethane compounds, triazine compounds, sulfonic acid esters, diphenyliodonium salts, triphenylsulfonium salts, sulfonium salts, ammonium salts, phosphonium salts, sulfonimide compounds, and the like.

Specific examples of the photo acid generators that can be used, including those described above, are 4-methoxyphenyl diphenyl sulfonium hexafluorophosphonate, 4-methoxyphenyl diphenyl sulfonium hexafluoroarsenate, 4-methoxyphenyl diphenyl sulfonium methane sulfonate, 4-methoxyphenyldiphenylsulfonium trifluoroacetate, triphenylsulfonium tetrafluoroborate, triphenylsulfonium tetrakis(pentafluorophenyl)borate, triphenylsulfonium hexafluorophosphonate, triphenylsulfonium hexafluoroarsenate, 4-methoxyphenyl diphenyl sulfonium-p-toluene sulfonate, 4-phenyl thiophenyl diphenyl tetrafluoroborate, 4-phenyl thiophenyl diphenyl hexafluorophosphonate, triphenyl sulfonium methanesulfonate, triphenylsulfonium trifluoroacetate, triphenylsulfonium-p-toluenesulfonate, 4-methoxyphenyl diphenylsulfonium tetrafluoroborate, 4-phenylthiophenyl diphenyl hexafluoroarsenate, 4-phenylthiophenyl diphenyl-p-toluenesulfonate, N-(trifluoromethylsulfonyloxy)succinimide, N-(trifluoromethylsulfonyloxy)phthalimide, 5-norbornene-2,3-dicarboximidyl triflate, 5-norbornene-2,3-dicarboximidyl-p-toluenesulfonate, 4-phenylthiophenyldiphenyltrifluoromethanesulfonate, 4-phenylthiophenyl diphenyl trifluoroacetate, N-(trifluoromethylsulfonyloxy)diphenylmaleimide, N-(trifluoromethylsulfonyloxy)bicyclo[2.2.1]hept-5-ene-2,3-dicarboximide, N-(trifluoromethylsulfonyloxy)-naphthylimide, N-(nonafluorobutylsulfonyloxy)naphthylimide, and the like.

In addition, when absorption of the h-line is not desired, use of 5-propylsulfonyloxyimino-5H-thiophen-2-ylidene-(2-methylphenyl)acetonitrile, 5-octylsulfonyl-oxyimino-5H-thiophene-2-ylidene-(2-methylphenyl)-acetonitrile, 5-camphorsulfonyloxyimino-5H-thiophene-2-ylidene-(2-methylphenyl)acetonitrile, 5-methylphenyl-sulfonyloxy-imino-5H-thiophene-2-ylidene-(2-methyl-phenyl)acetonitrile should be avoided, since they have absorption in the wavelength region of h-line.

Examples of the photo base generator include multi-substituted amide compounds having an amide group, lactams, imide compounds or ones containing its structure.

In addition, an ionic photo base generator including, as anion, an amide anion, a methide anion, a borate anion, a phosphate anion, a sulfonate anion, a carboxylate anion, or the like can also be used.

In the present invention, the photo thermal acid generator or the photo thermal base generator means the compound which change the chemical structure upon exposure but do not generate an acid or base, and thereafter bond cleavage occurs due to heat to generate an acid or a base. Of these, the photo thermal base generator is preferable. Preferred photo thermal base generator includes those represented by the following formula (II), more preferably hydrates or solvates thereof. The compound represented by the formula (II) becomes unstable and the decomposition temperature decreases when inversion to cis-form occurs due to exposure to light, and the base is generated even if the baking temperature is about 100° C. in the subsequent process.

When positive type photosensitivity is imparted, the compound represented by the formula (II) need not be adjusted with the absorption wavelength of the diazonaphthoquinone derivative that is described later.

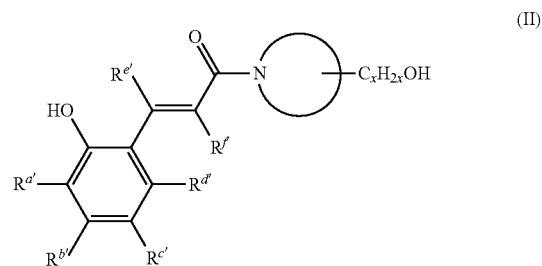

(II)

wherein, x is an integer of 1 or more and 6 or less, and $R^{a'}$ to $R^{f'}$ are each independently hydrogen, halogen, hydroxy, mercapto, sulfide, silyl, silanol, nitro, nitroso, sulfino, sulfo, sulfonato, phosphino, phosphinyl, phosphono, phosphonato, amino, ammonium, a $C_{1-20}$ aliphatic hydrocarbon group which may contain a substituent, a $C_{6-22}$ aromatic hydrocarbon group which may contain a substituent, a $C_{1-20}$ alkoxy which may contain a substituent, or a $C_{6-20}$ aryloxy group which may contain a substituent.

Among these, $R^{a'}$ to $R^{d'}$ are particularly preferably hydrogen, hydroxy, $C_{1-6}$ aliphatic hydrocarbon group, or $C_{1-6}$ alkoxy, and $R^{e'}$ and $R^{f'}$ are particularly preferably hydrogen. Two or more of $R^{1'}$ to $R^{4'}$ may be combined to form a cyclic structure. At this time, the cyclic structure may contain a hetero atom.

N is a constituent atom of a nitrogen-containing heterocyclic ring, the nitrogen-containing heterocyclic ring is a 3- to 10-membered ring, and the nitrogen-containing heterocyclic ring may further have a $C_{1-20}$, in particular $C_{1-6}$, aliphatic hydrocarbon group, which may contain one or more substituents that are different from $C_xH_{2x}OH$ shown in the formula (II).

It is preferred that $R^{a'}$ to $R^{d'}$ are appropriately selected according to the exposure wavelength to be used. In display applications, for example, unsaturated hydrocarbon bonding functional groups such as vinyl and alkynyl which shift the absorption wavelength to g-, h- and i-lines, alkoxy, nitro and the like are used, and methoxy and ethoxy are particularly preferred.

Specifically, the following can be included.

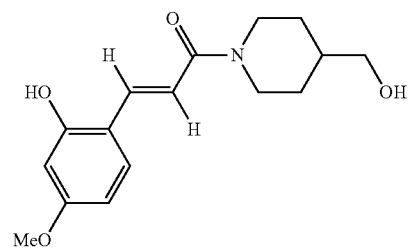

-continued

[Chemical structures shown]

When the composition of the present invention is a non-photosensitive composition, it is preferable to comprise a thermal acid generator or a thermal base generator. In the present invention, the thermal acid generator or the thermal base generator means the compound in which bond cleavage occurs due to heat to generate an acid or a base. It is preferable for them to generate little or no acid or base at the heating of pre-baking after the coating the composition.

Examples of the thermal acid generators include salts and esters that generate organic acids, such as various aliphatic sulfonic acids and salts thereof, various aliphatic carboxylic acids such as citric acid, acetic acid and maleic acid and salts thereof, various aromatic carboxylic acids such as benzoic acid and phthalic acid and salts thereof, aromatic sulfonic acids and ammonium salts thereof, various amine salts, aromatic diazonium salts, and phosphonic acids and salts thereof.

Among the thermal acid generators, in particular, it is preferably a salt composed of an organic acid and an organic base, further preferably a salt composed of sulfonic acid and an organic base. Preferred sulfonic acids include p-toluenesulfonic acid, benzenesulfonic acid, p-dodecylbenzenesulfonic acid, 1,4-naphthalenedi-sulfonic acid, methanesulfonic acid, and the like. These acid generators can be used alone or in combination.

Examples of the thermal base generators include compounds that generate bases such as imidazole, tertiary amine and quaternary ammonium, and mixtures thereof. Examples of the bases to be released include imidazole derivatives such as N-(2-nitrobenzyloxycarbonyl) imidazole, N-(3-nitrobenzyloxycarbonyl) imidazole, N-(4-nitrobenzyloxycarbonyl) imidazole, N-(5-methyl-2-nitrobenzyloxycarbonyl) imidazole and N-(4-chloro-2-nitrobenzyloxycarbonyl) imidazole, and 1,8-diazabicyclo[5.4.0]undecene-7. Like the acid generators, these base generators can be used alone or in combination.

Other additives include a surfactant, a developer-dissolution promoter, a scum remover, an adhesion enhancing agent, a polymerization inhibitor, an antifoaming agent, a photosensitizing enhancing agent, and the like.

Since the surfactant can improve coatability, it is preferable to use it. Examples of the surfactant that can be used in the polysiloxane composition of the present invention include nonionic surfactants, anionic surfactants, amphoteric surfactants, and the like.

Examples of the nonionic surfactant include, polyoxyethylene alkyl ethers, such as polyoxyethylene lauryl ether, polyoxyethylene oleyl ether and polyoxyethylene cetyl ether; polyoxyethylene fatty acid diester; polyoxy fatty acid monoester; polyoxyethylene polyoxypropylene block polymer; acetylene alcohol; acetylene glycol; acetylene alcohol derivatives, such as polyethoxylate of acetylene alcohol; acetylene glycol derivatives, such as polyethoxylate of acetylene glycol; fluorine-containing surfactants, such as Fluorad (trade name, manufactured by Sumitomo 3M Limited), Megafac (trade name, manufactured by DIC Corporation), Surufuron (trade name, Asahi Glass Co., Ltd.); or organosiloxane surfactants, such as KP341 (trade name, manufactured by Shin-Etsu Chemical Co., Ltd.). Examples of said acetylene glycol include 3-methyl-1-butyne-3-ol, 3-methyl-1-pentyn-3-ol, 3,6-dimethyl-4-octyne-3,6-diol, 2,4,7,9-tetramethyl-5-decyne-4,7-diol, 3,5-dimethyl-1-hexyne-3-ol, 2,5-dimethyl-3-hexyne-2,5-diol, 2,5-dimethyl-2,5-hexane-diol and the like.

Further, examples of the anionic surfactant include ammonium salt or organic amine salt of alkyl diphenyl ether disulfonic acid, ammonium salt or organic amine salt of alkyl diphenyl ether sulfonic acid, ammonium salt or organic amine salt of alkyl benzene sulfonic acid, ammonium salt or organic amine salt of polyoxyethylene alkyl ether sulfuric acid, ammonium salt or organic amine salt of alkyl sulfuric acid and the like.

Further, examples of the amphoteric surfactant include 2-alkyl-N-carboxymethyl-N-hydroxyethyl imidazolium betaine, lauric acid amide propyl hydroxysulfone betaine and the like.

These surfactants can be used alone or as a mixture of two or more kinds, and the mixing ratio thereof is usually 50 to 10,000 ppm, preferably 100 to 5,000 ppm, based on the total mass of the composition.

When the composition of the present invention is photosensitive, the developer-dissolution promoter or the scum remover has functions of controlling solubility of the formed coating film in a developer and of preventing scum from remaining on the substrate after development. As this additive, crown ethers can be adopted. The amount thereof is preferably 0.05 to 15 mass parts, more preferably 0.1 to 10 mass parts, based on 100 mass parts based on the total mass of the polysiloxane.

When the composition of the present invention is photosensitive, according to necessity, a photosensitizing enhancing agent can be contained. Examples of the positive type photosensitizing enhancing agent preferably include coumarin, ketocoumarin, derivatives thereof, acetophenone, and sensitizing dye such as pyrylium salts and thiopyrylium salts.

As the photosensitizing enhancing agent, it is also possible to adopt a compound having an anthracene skeleton. When the photosensitizing enhancing agent is containted in the composition, the amount is preferably 0.01 to 5 mass parts based on the total mass of the polysiloxane.

When the composition of the present invention is photosensitive, examples of the polymerization inhibitor include nitrone, nitroxide radical, hydroquinone, catechol, phenothiazine, phenoxazine, hindered amine, derivatives thereof, and UV absorbers. The amount is preferably 0.01 to 20 mass parts based on the total mass of the polysiloxane.

Examples of the antifoaming agent include: alcohols ($C_1$ to $C_{18}$); higher fatty acids, such as, oleic acid and stearic acid; higher fatty acid esters, such as, glycerin monolaurate; polyethers, such as, polyethylenglycol (PEG) (Mn: 200 to 10,000) and polypropyleneglycol (PPG) (Mn: 200 to 10,000); silicone compounds, such as, dimethyl silicone oil, alkyl-modified silicone oil and fluoro-silicone oil; and organic siloxane surfactants described below in detail. Those can be used singly or in combination of two or more. The amount thereof is preferably 0.1 to 3 mass parts based on 100 mass parts based on the total mass of the polysiloxane.

In the process for forming a cured film from the composition of the present invention, the adhesion enhancing agent has a function of preventing a pattern of the film from being peeled off by stress formed after curing. As the adhesion enhancing agent, imidazoles and silane coupling agents are preferably adopted.

These other additives can be used singly or in combination of two or more and the amount thereof is 20 mass parts or less, preferably 0.05 to 15 mass parts, based on the total mass of the polysiloxane.

<Cured Film and Electronic Device Comprising the Same>

The cured film according to the present invention can be manufactured by applying the composition according to the present invention on a substrate and heating it. When the composition according the present invention is a photosensitive composition, it can form a patterned cured film.

First, the above-described composition is applied on a substrate. Formation of the coating film of the composition in the present invention can be carried out by a freely selected method conventionally known as a method for coating a composition. Specifically, it can be freely selected from dip coating, roll coating, bar coating, brush coating, spray coating, doctor coating, flow coating, spin coating, slit coating and the like.

Further, as the substrate on which the composition is applied, a suitable substrate such as a silicon substrate, a glass substrate, a resin film, or the like can be used. Various semiconductor devices and the like may have been formed on these substrates as needed. When the substrate is a film, gravure coating can also be used. If desired, a drying process may be additionally set after coating the film. Further, if necessary, the coating process can be repeated once or twice or more to make the film thickness of the formed coating film as desired.

After forming the coating film of the composition according to the present invention, it is preferable to carry out pre-baking (heat treatment) of the coating film in order to dry the coating film and reduce the remaining amount of the solvent. The pre-baking process can be generally carried out at a temperature of 70 to 150° C., preferably 90 to 120° C., in the case of a hot plate, for 10 to 180 seconds, preferably 30 to 90 seconds and in the case of a clean oven, for 1 to 30 minutes.

When the composition is non-photosensitive, the coating film is then cured by heating it. The heating temperature in this heating process is not particularly limited as long as it is a temperature at which the coating film can be cured and can be freely determined. However, if a silanol group remains, chemical resistance of the cured film may become insufficient or the dielectric constant of the cured film may become high. From this viewpoint, for the heating temperature, relatively high temperature is generally selected. In order to promote the curing reaction to obtain a sufficient cured film, the curing temperature is preferably 200° C. or more, more preferably 300° C. or more, particularly preferably 450° C. or more. Generally, as long as the curing temperature becomes higher, cracks are likely to occur in the film, but cracks are less likely to occur when the composition of the present invention is used. Further, the heating time is not particularly limited, and is generally determined to be 10 minutes to 24 hours, preferably 30 minutes to 3 hours. In addition, this heating time is the time after the temperature of the patterned film reaches a desired heating temperature. Normally, it takes from several minutes to several hours until the patterned film reaches a desired temperature from the temperature before heating.

When the composition is photosensitive, after the coating film is formed, the surface of the coating film is irradiated with light. As a light source to be used for the light irradiation, any one conventionally used for a pattern forming method can be used. As such a light source, a high-pressure mercury lamp, a low-pressure mercury lamp, a lamp such as metal halide and xenon, a laser diode, an LED and the like can be included. Ultraviolet rays such as g-line, h-line and i-line are usually used as the irradiation light. Except ultrafine processing for semiconductors or the like, it is general to use light of 360 to 430 nm (high-pressure mercury lamp) for patterning of several μm to several ten μm. Above all, in the case of liquid crystal display devices, light of 430 nm is often used. The energy of the irradiation light is generally 5 to 2,000 mJ/cm², preferably 10 to 1,000 mJ/cm², although it depends on the light source and the film thickness of the coating film. If the irradiation light energy is lower than 5 mJ/cm², sufficient resolution may not be obtained in some cases. On the other hand, when the irradiation light energy is higher than 2,000 mJ/cm², the exposure becomes excess and halation may be generated.

In order to irradiate light in a pattern shape, a general photomask can be used. Such a photomask can be freely selected from well-known ones. The environment at the time of irradiation is not particularly limited, and generally it may be set as an ambient atmosphere (in the air) or nitrogen atmosphere. In the case of forming a film on the entire surface of the substrate, light irradiation may be performed to the entire surface of the substrate. In the present invention, the pattern film also includes such a case where a film is formed on the entire surface of the substrate.

In order to promote reactions between polymers by generated acid or base in the exposure portion after exposure, the post exposure baking process (Post Exposure Baking) can be performed as needed, especially in the case of negative type. This heat treatment is different from below mentioned heating step. It is performed not for curing the coating film perfectly, but for remaining desired patterns on the substrate after development and removing the other portion by the development. When the post exposure bake is performed, a hot plate, an oven, a furnace and the like can be used. The heating temperature should not be excessively high since the acid or base in the exposed portion generated by the irradiation is preferably not diffused to the non-exposed area. From this view point, the heating temperature after the exposure is preferably 40° C. to 150° C., and more preferably 60° C. to 120° C. To control the curing rate of the composition, optionally step baking can be applied. The environment at the time of heating is not particularly limited, but to control the curing rate of the composition, it can be selected from in inert gas such as nitrogen, under vacuum, under reduced pressure, in oxygen gas, and the like. The heating time is preferably a certain level or more to maintain higher uniformity of temperature history in the wafer, and preferably not too excessively long to control the diffusion of the generated acid or base. From this view point, the heating time is preferably 20 seconds to 500 seconds, and more preferably 40 seconds to 300 seconds. When the positive type photosensitive composition is used, the exposure baking is preferably not performed in order not to generate the acid or base of the photo acid generator, the photo base generator, the thermal acid generator, or the thermal base generator at this step, or in order not to promote crosslinking between polymers.

After the exposure to light, the coating film is developed. As the developing solution to be used at the time of development, any developing solution conventionally used for developing the photosensitive composition can be used. Preferable examples of the developing solution include an alkali developing solution which is an aqueous solution of an alkaline compound such as tetraalkylammonium hydroxide, choline, alkali metal hydroxide, alkali metal metasilicate (hydrate), alkali metal phosphate (hydrate), aqueous ammonia, alkylamine, alkanolamine and heterocyclic amine, and a particularly preferable alkali developing solution is a TMAH aqueous solution. In the alkali developing solution, a water-soluble organic solvent such as methanol, ethanol, or a surfactant may be further contained, if necessary. The developing method can also be freely selected from conventionally known methods. Specifically, methods such as dipping in a developing solution (dip), paddle, shower, slit, cap coat, spray and the like can be included. After development with the developer, by which a pattern can be obtained, it is preferable that rinsing with water is carried out.

Thereafter, an entire surface exposure (flood exposure) process is usually performed. When a photo acid generator or a photo base generator is used, an acid or a base is generated in this entire surface exposure process. When a photo thermal acid generator or a photo thermal base generator is used, the chemical structure of the photo thermal acid generator or the photo thermal base generator is changed in this entire surface exposure process. Further, when the unreacted diazonaphthoquinone derivative is existed in the film, it is decomposed by light to further improve the optical transparency of the film. Thus, it is preferable to perform the entire surface exposure process when transparency is required. When a thermal acid generator or a thermal base generator is selected, the entire surface exposure is not essential, but it is preferable to perform the entire surface exposure for the above purpose. As the method of entire surface exposure, there is a method for exposing light over the entire surface with about 100 to 2,000 mJ/cm$^2$ (in terms of exposure amount at wavelength of 365 nm) using an ultraviolet visible exposure machine such as an aligner (for example, PLA-501F manufactured by Canon Inc.).

After development, the coating film obtained is cured by heating. The heating conditions is the same as as the above case of using the non-photosensitive composition.

The cured film according to the present invention can be thickened. The film thickness range in which cracks do not occur is 0.1 μm to 500 μm after curing at 300° C. and 0.1 μm to 10 μm after curing at 450° C., although it depends on the pattern size.

Further, the cured film according to the present invention has high transmittance. Specifically, the transmittance for the light having wavelength of 400 nm is preferably 90% or more.

The cured film thus formed can be suitably utilized in many fields, not only as a planarization film, an interlayer insulating film, a transparent protective film and the like for various devices such as a flat panel display (FPD) but also as an interlayer insulating film for low temperature polysilicon or a buffer coat film for IC chip and the like. Further, the cured film can be also used as an optical device material or the like.

The formed cured film is thereafter subjected to further post-processing of the substrate such as processing or circuit formation, if necessary, and an electronic device is formed. Any of conventionally known methods can be applied to the post-processing.

The present invention is explained more specifically below by use of Examples and Comparative Examples, but the present invention is not limited by these Examples and Comparative Examples at all.

Synthesis Example 1 (Synthesis of Polysiloxane A)

Into a 2 L flask equipped with a stirrer, a thermometer and a cooling pipe, 171 g of 25% TMAH aqueous solution, 600 ml of isopropyl alcohol (IPA) and 4.0 g of water were charged, and then in a dropping funnel, a mixed solution of 36.7 g of methyltrimethoxysilane, 125 g of phenyltrimethoxysilane and 28.6 g of 1,4-bis(dimethylmethoxysilyloxy)benzene were prepared. The mixed solution was dropped into the flask at 40° C., stirred at the same temperature for 2 hours, and then neutralized by adding 10% HCl aqueous solution. 400 ml of toluene and 600 ml of water were added to the neutralized solution and the mixture was separated into two phases. Then the aqueous phase was removed. The organic phase was washed three times with 300 ml of water and the obtained organic phase was concentrated under reduced pressure to remove the solvent and adjusted to add PGMEA to have 35 mass % solid concentration.

When the molecular weight (in terms of polystyrene) of the obtained polysiloxane was measured by GPC, the mass average molecular weight (hereinafter sometimes abbreviated as "Mw") was 1,200. In addition, when the obtained resin solution was coated on a silicon wafer by a spin coater (MS-A100, manufactured by Mikasa Co., Ltd.) so as to make the film thickness after pre-baking to be 2 μm and ADR in 2.38% TMAH aqueous solution was measured after pre-baking, it was 1,000 Å/sec.

Synthesis Example 2 (Synthesis of Polysiloxane B)

Into a 2 L flask equipped with a stirrer, a thermometer and a cooling pipe, 196 g of 25% TMAH aqueous solution, 600 ml of IPA and 4.0 g of water were charged, and then in a dropping funnel, a mixed solution of 28.6 g of methyltrimethoxysilane, 97.2 g of phenyltrimethoxysilane and 85.8 g of 1,4-bis(dimethylmethoxysilyloxy)benzene were prepared. The mixed solution was dropped into the flask at 40° C., stirred at the same temperature for 2 hours, and then neutralized by adding 10% HCl aqueous solution. 400 ml of toluene and 600 ml of water were added to the neutralized solution and the mixture was separated into two phases. Then the aqueous phase was removed. The organic phase was washed three times with 300 ml of water and the obtained organic phase was concentrated under reduced pressure to remove the solvent and adjusted to add PGMEA to have 35 mass % solid concentration.

The polysiloxane thus obtained had Mw of 1,800 and ADR of 1,200 Å/sec.

Synthesis Example 3 (Synthesis of Polysiloxane C)

Into a 2 L flask equipped with a stirrer, a thermometer and a cooling pipe, 216 g of 25% TMAH aqueous solution, 600 ml of IPA and 4.0 g of water were charged, and then in a dropping funnel, a mixed solution of 19.0 g of methyltrimethoxysilane, 55.4 g of phenyltrimethoxysilane and 85.8 g of 1,4-bis(dimethylmethoxysilyloxy)benzene were prepared. The mixed solution was dropped into the flask at 40° C., stirred at the same temperature for 2 hours, and then neutralized by adding 10% HCl aqueous solution. 400 ml of toluene and 600 ml of water were added to the neutralized solution and the mixture was separated into two phases. Then the aqueous phase was removed. The organic phase was washed three times with 300 ml of water and the obtained organic phase was concentrated under reduced pressure to remove the solvent and adjusted to add PGMEA to have 35 mass % solid concentration.

The polysiloxane thus obtained had Mw of 2,200 and ADR of 900 Å/sec.

Synthesis Example 4 (Synthesis of Polysiloxane D)

Into a 2 L flask equipped with a stirrer, a thermometer and a cooling pipe, 256 g of 25% TMAH aqueous solution, 600 ml of IPA and 4.0 g of water were charged, and then in a dropping funnel, a mixed solution of 19.0 g of methyltrimethoxysilane, 55.4 g of phenyltrimethoxysilane, 43.1 g of tris-(3-trimethoxysilylpropyl)isocyanurate and 85.8 g of 1,4-bis(dimethylmethoxysilyloxy)benzene were prepared. The mixed solution was dropped into the flask at 40° C., stirred at the same temperature for 2 hours, and then neutralized by adding 10% HCl aqueous solution. 400 ml of toluene and 600 ml of water were added to the neutralized solution and the mixture was separated into two phases. Then the aqueous phase was removed. The organic phase was washed three times with 300 ml of water and the obtained organic phase was concentrated under reduced pressure to remove the solvent and adjusted to add PGMEA to have 35 mass % solid concentration.

The polysiloxane thus obtained had Mw of 4,200 and ADR of 900 Å/sec.

Synthesis Example 5 (Synthesis of Polysiloxane E)

Into a 1 L three-necked flask equipped with a stirrer, a thermometer and a cooling pipe, 8 g of 35% HCl aqueous solution, 400 g of PGMEA and 27 g of water were charged, and then a mixed solution of 39.7 g of phenyltrimethoxysilane, 34.1 g of methyltrimethoxysilane, 30.8 g of tris-(3-trimethoxysilylpropyl) isocyanurate and 0.3 g of trimethoxysilane was prepared. The mixed solution was dropped into said flask at 10° C. and stirred at the same temperature for 3 hours. Then, 300 g of propyl acetate was added, and the mixture was separated into an oil layer and an aqueous layer with a separating funnel. In order to further remove the sodium remaining in the oil layer after separation, the layer was washed four times with 200 g of water, and it was confirmed that the pH of the waste water tank was 4 to 5. The obtained organic layer was concentrated under reduced pressure to remove the solvent and adjusted to a PGMEA solution.

The polysiloxane thus obtained had Mw of 18,000 and ADR of 900 Å/sec.

Comparative Synthesis Example 1 (Synthesis of Polysiloxane F)

Into a 1 L three-necked flask equipped with a stirrer, a thermometer and a cooling pipe, 168 g of phenyltriethoxysilane and 53.5 g of methyltriethoxysilane were charged. Thereafter, 300 g of PGMEA was added and the mixture was stirred at a predetermined stirring speed. Then, 30 g of caustic soda dissolved in 18 g of water was added into the flask and reaction was performed for 1 hour. Further, 18 g of acetic acid and 54 g of water were added and reaction was performed for 1 hour, and then neutralized by adding 10% HCl aqueous solution. 400 ml of toluene and 600 ml of water were added to the neutralized solution and the mixture was separated into two phases. Then the aqueous phase was removed. The organic phase was washed three times with 300 ml of water and the obtained organic phase was concentrated under reduced pressure to remove the solvent and adjusted to add PGMEA to have 35 mass % solid concentration.

The polysiloxane thus obtained had Mw of 1,600.

Comparative Synthesis Example 2 (Synthesis of Polysiloxane G)

Into a 500 mL three-necked flask equipped with a stirrer, a thermometer and a cooling pipe, 71.5 g of 1,4-bis(dimethylmethoxysilyloxy)benzene was charged. Thereafter, 60 g of PGME was added and the mixture was stirred at a predetermined stirring speed. Then, 1.52 g of 35% HCl and 7 g of water were added into the flask and reaction was performed for 2 hour. Further, 100 ml of toluene was added and the mixture was separated into an organic phase and an aqueous phase with a separating funnel. Then the aqueous phase was removed. The organic phase was washed three times with 100 ml of water and the obtained organic phase was concentrated under reduced pressure to remove the solvent and adjusted to add PGMEA to have 35 mass % solid concentration.

The polysiloxane thus obtained had Mw of 300. It was difficult to synthesize high molecular weight polysiloxane.

Preparation of Non-Photosensitive Compositions a to E, and Comparative Compositions P and Q To 100 parts by mass of the polysiloxane A, 0.1 parts by mass of KF-53 (Sin-Etsu Chemical Co.,) as a surfactant is added and the mixture was stirred, to prepare a composition A.

Further, to each 100 parts by mass of the polysiloxane A, 100 parts by mass of the polysiloxane B, 100 parts by mass of the polysiloxane C, and 100 parts by mass of the polysiloxane D, 500 ppm of 1,8-diazabicyclo[5.4.0]undecene-7-orthophtalic acid salt as a thermal acid generator and 0.1 parts by mass of KF-53 were added and the mixture were stirred, to prepare compositions B, C, D, and E respectively.

Further, to each 100 parts by mass of the polysiloxane F and 100 parts by mass of the polysiloxane polysiloxane G, 500 ppm of 1,8-diazabicyclo[5.4.0]undecene-7-orthophtalic acid salt as a thermal acid generator and 0.1 parts by mass of KF-53 were added and the mixture were stirred, to prepare comparative compositions P and Q respectively.

Preparation of Positive Type Photosensitive Composition F

To 100 parts by mass of the polysiloxane A, 4 parts by mass of 4,4'-(1-(4-(1-(4-hydroxyphenyl)-1-methylethyl) phenyl)ethylidene)-bisphenol modified with 2.0 mole of diazonaphthoquinone, as a diazonaphthoquinone derivative, 1 parts by mass of 1,8-naphthalimidyl triflate, trade name "NAI-105", manufactured by Midori Kagaku Co., Ltd. (this has no absorption peak at wavelength of 400 to 800 nm) as a photo acid generator, and 0.1 parts by mass of KF-53 as a surfactant were added and the mixture was stirred, to prepare a composition F.

The composition F was coated on a 4-inch silicon wafer by spin coating so that the final film thickness became 2 µm. The obtained coating film was prebaked at 100° C. for 90 seconds to evaporate the solvent. The dried coating film was exposed to light in a pattern shape with 100 to 200 mJ/cm² by means of g+h+i lines mask aligner (PLA-501F type, product name, manufactured by Canon Inc.). It was subjected to puddle development for 90 seconds using 2.38% TMAH aqueous solution and further rinsed with pure water for 60 seconds. The obtained pattern was 5 µm 1:1 contact hole and it was confirmed that the exposed portion was free from residue and excellent patterns was obtained.

Preparation of Positive Type Photosensitive Composition G

Composition G was prepared by the same method as above composition F except for using 80 parts by mass of polysiloxane A and 20 parts by mass of polysiloxane E, instead of 100 parts by mass of polysiloxane A.

The composition G was coated on a 4-inch silicon wafer by spin coating so that the final film thickness became 2 µm. The obtained coating film was prebaked at 100° C. for 90 seconds to evaporate the solvent. The dried coating film was exposed to light in a pattern shape with 100 to 200 mJ/cm² by means of g+h+i lines mask aligner. Then, it was subjected to puddle development for 90 seconds using 2.38% TMAH aqueous solution and further rinsed with pure water for 60 seconds. The obtained pattern was 5 µm 1:1 contact hole and it was confirmed that the exposed portion was free from residue and excellent patterns was obtained.

Preparation of Negative Type Photosensitive Composition H

To 100 parts by mass of the polysiloxane A, 2 parts by mass of 1,8-naphthalimidyl triflate as a photo acid generator and 0.1 parts by mass of KF-53 as a surfactant were added and the mixture was stirred, to prepare a composition H.

The composition H was coated on a 4-inch silicon wafer by spin coating so that the final film thickness became 2 µm. The obtained coating film was prebaked at 100° C. for 90 seconds to evaporate the solvent. The dried coating film was exposed to light in a pattern shape with 100 to 200 mJ/cm² by means of g+h+i lines mask aligner (PLA-501F type, product name, manufactured by Canon Inc.) After the exposure, it was heated 100° C. for 60 seconds and then subjected to puddle development for 60 seconds using 2.38% TMAH aqueous solution and further rinsed with pure water for 60 seconds. The obtained pattern was 5 µm 1:1 contact hole and it was confirmed that the exposed portion was free from residue and excellent patterns was obtained.

[Crack Threshold]

Each composition was coated on a 4-inch glass substrate by spin coating, and the obtained coating film was prebaked at 100° C. for 90 seconds.

From comparative composition Q, a white crystalline film was obtained after prebaking, and a transparent and uniform film was not obtained. It was estimated due to the high crystallinity of the polysiloxane having small molecular weight.

Positive type photosensitive compositions F and G were each still-standing in 2.38% TMAH aqueous solution for 90 seconds and further rinsed with pure water for 60 seconds.

Negative type photosensitive composition H was exposed to light in a pattern shape with 100 mJ/cm² by means of g+h+i lines mask aligner, still-standing in 2.38% TMAH aqueous solution for 60 seconds and further rinsed with pure water for 60 seconds.

Then, composition F, G, and H were each subjected to flood exposure with 1,000 mJ/cm² by means of g+h+i lines mask aligner.

Thereafter, the coating films obtained from the compositions A to H and the comparative composition P were cured by heating at 300° C. for 60 minutes. The surface was visually observed to confirm the presence or absence of cracks. The critical film thickness at which cracks occurred was measured and evaluated as described below. The obtained results were as shown in Table 1.

A: no crack was confirmed when the film thickness was 100 µm (the critical film thickness: more than 100 µm).

B: crack was confirmed when the film thickness was 5 µm or more and less than 100 µm (the critical film thickness 5 µm or more and less than 100 µm).

C: crack was confirmed when the film thickness was less than 5 µm (the critical film thickness: less than 5 µm).

Above cured films were further heated at 450° C. for 60 minutes and the critical film thickness at which cracks occurred was measured in the same manner as above. It was evaluated as described below and the obtained results were as shown in Table 1.

A: no crack was confirmed when the film thickness was 2 µm (the critical film thickness: more than 2 µm).

B: crack was confirmed when the film thickness was 1 µm or more and less than 2 µm (the critical film thickness: 1 µm or more and less than 2 µm).

C: crack was confirmed when the film thickness was less than 1 µm (the critical film thickness: less than 1 µm).

TABLE 1

|  | Critical film thickness for crack at 300° C. | Critical film thickness for crack at 450° C. |
| --- | --- | --- |
| Composition A | A | A |
| Composition B | A | A |
| Composition C | A | A |
| Composition D | A | A |
| Composition E | A | A |
| Composition F | A | A |
| Composition G | A | A |
| Composition H | A | A |
| Comparative Composition P | B | C |

[Transmittance]

When transmittance of the obtained cured film at 400 nm was measured by means of MultiSpec-1500 manufactured by Shimadzu Corporation, all of them were 90% or more.

The invention claimed is:

1. A method for producing a cured film manufactured by applying a composition on a substrate and heating is performed at 450° C. or more and wherein the composition comprises a polysiloxane (Pa) comprising:

a repeating unit represented by the following formula (Ia):

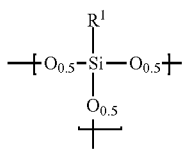

(Ia)

wherein
$R^1$ is hydrogen, a monovalent, linear, branched or cyclic, saturated or unsaturated $C_{1-30}$ aliphatic hydrocarbon group, or a monovalent, $C_{6-30}$ aromatic hydrocarbon group,
in said aliphatic hydrocarbon group and said aromatic hydrocarbon group, one or more methylene are unsubstituted or substituted with oxy, imide or carbonyl, one or more hydrogens are unsubstituted or substituted with fluorine, hydroxy or alkoxy, and one or more carbons are unsubstituted or substituted with silicon; and
a repeating unit represented by the following formula (Ib):

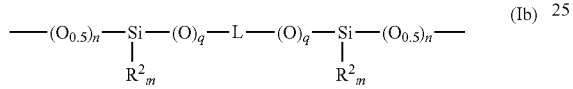

(Ib)

wherein
$R^2$ is each independently hydrogen, $C_{1-10}$ alkyl, $C_{6-20}$ aryl or $C_{2-10}$ alkenyl, which is unsubstituted or substituted with oxygen or nitrogen,
L is each independently phenylene, naphthylene or biphenylene, which is unsubstituted or substituted with oxygen or nitrogen,
m is each independently an integer of 2,
n is each independently an integer of 1,
q is 1 and
a solvent.

2. The method according to claim 1, wherein the polysiloxane (Pa) further comprises a repeating unit represented by the following formula (Ic)

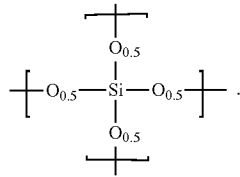

(Ic)

3. The method according to claim 1, wherein the repeating unit represented by said formula (Ib) is 0.5 to 50 mol % based on the total number of the repeating units of said polysiloxane.

4. The method according to claim 1, wherein L in said formula (Ib) is an unsubstituted $C_{6-20}$ arylene.

5. The method according to claim 1, wherein the polysiloxane (Pa) has a mass average molecular weight of 500 to 25,000.

6. The method according to claim 1, wherein the polysiloxane (Pa) has a dissolution rate after prebaking in 2.38 mass % tetramethylammonium hydroxide aqueous solution of 50 to 20,000 Å/sec.

7. The method according to claim 1, wherein the composition further comprises a polysiloxane (Pb) which comprises the repeating unit represented by the following formula (Ia) and does not comprise the repeating unit represented by the following formula (Ib):

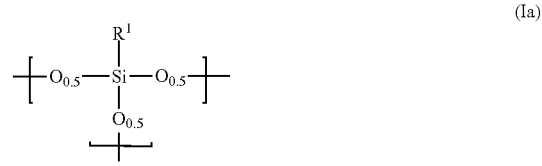

(Ia)

wherein,
$R^1$ is hydrogen, a monovalent, linear, branched or cyclic, saturated or unsaturated $C_{1-30}$ aliphatic hydrocarbon group, or a monovalent, $C_{6-30}$ aromatic hydrocarbon group,
in said aliphatic hydrocarbon group and said aromatic hydrocarbon group, one or more methylene are unsubstituted or substituted with oxy, imide or carbonyl, one or more hydrogens are unsubstituted or substituted with fluorine, hydroxy or alkoxy, and one or more carbons are unsubstituted or substituted with silicon,

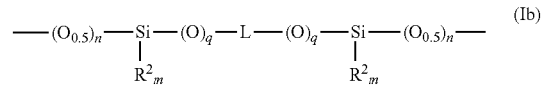

(Ib)

wherein,
$R^2$ is each independently hydrogen, $C_{1-10}$ alkyl, $C_{6-20}$ aryl or $C_{2-10}$ alkenyl, which is unsubstituted or substituted with oxygen or nitrogen,
L is each independently phenylene, naphthylene or biphenylene, which is unsubstituted or substituted with oxygen or nitrogen,
m is each independently an integer of 2,
n is each independently an integer of 1,
q is 1.

8. The method according to claim 7, wherein said polysiloxane (Pb) further comprises a repeating unit represented by the following formula (Ic):

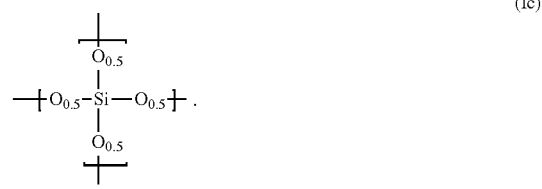

(Ic)

9. The method according to claim 1, wherein the composition further comprises a silanol condensation catalyst.

10. The method according to claim 1, wherein the composition further comprises a diazonaphthoquinone derivative.

11. The method according to claim 1, wherein the repeating unit represented by said formula (Ib) is 0.5 to 50 mol % based on the total number of the repeating units of said polysiloxane.

12. The method for producing a cured film manufactured by applying a composition on a substrate and heating wherein the composition comprises a polysiloxane (Pa) comprising:

a repeating unit represented by the following formula (Ia):

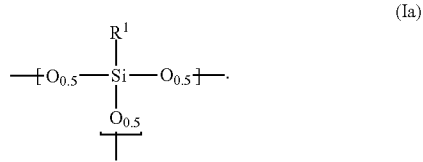

wherein,

R$^1$ is hydrogen, a monovalent to trivalent, linear, branched or cyclic, saturated or unsaturated C$_{1\text{-}30}$ aliphatic hydrocarbon group, or a monovalent to trivalent, C$_{6\text{-}30}$ aromatic hydrocarbon group, in said aliphatic hydrocarbon group and said aromatic hydrocarbon group, one or more methylene are unsubstituted or substituted with oxy, imide or carbonyl, one or more hydrogens are unsubstituted or substituted with fluorine, hydroxy or alkoxy, and one or more carbons are unsubstituted or substituted with silicon, when R$^1$ is divalent or trivalent, R$^1$ connects Si atoms contained in a plurality of repeating units; and a repeating unit represented by the following formula (Ib):

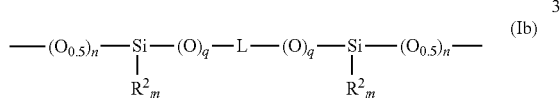

wherein,

R$^2$ is each independently hydrogen, C$_{1\text{-}10}$ alkyl, C$_{6\text{-}20}$ aryl or C$_{2\text{-}10}$ alkenyl, which is unsubstituted or substituted with oxygen or nitrogen, or a linking group represented by the formula (Ib'):

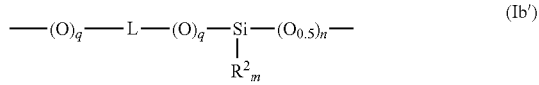

L is each independently C$_{6\text{-}20}$ arylene, which is unsubstituted or substituted with oxygen or nitrogen, m is each independently an integer of 0 to 2, n is each independently an integer of 1 to 3, q is each independently 0 or 1, the total number of n, the number of O$_{0.5}$, and m, the number of R$^2$, bonding to one Si is 3, and the total number of q contained in the repeating unit represented by the above formula (Ib) is 1 or more, and a solvent, wherein the heating is performed at 450° C. or more.

13. The method according to claim 12, wherein n is 1 in said general formula (Ib).

14. The method according to claim 12, wherein L in said formula (Ib) is an unsubstituted C$_{6\text{-}20}$ arylene.

15. The method according to claim 12, wherein the polysiloxane (Pa) further comprises a repeating unit represented by the following formula (Ic)

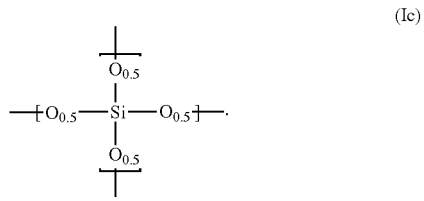

16. The method according to claim 12, wherein the repeating unit represented by said formula (Ib) is 0.5 to 50 mol % based on the total number of the repeating units of said polysiloxane.

17. The method according to claim 12, wherein the polysiloxane (Pa) has a mass average molecular weight of 500 to 25,000.

18. The method according to claim 12, wherein the polysiloxane (Pa) has a dissolution rate after prebaking in 2.38 mass % tetramethylammonium hydroxide aqueous solution of 50 to 20,000 Å/sec.

* * * * *